United States Patent [19]

Kapoor

[11] Patent Number: 5,166,094
[45] Date of Patent: Nov. 24, 1992

[54] METHOD OF FABRICATING A BASE-COUPLED TRANSISTOR LOGIC

[75] Inventor: Ashok K. Kapoor, Palo Alto, Calif.

[73] Assignee: Fairchild Camera & Instrument Corp., Mountain View, Calif.

[21] Appl. No.: 539,710

[22] Filed: Jun. 18, 1990

Related U.S. Application Data

[62] Division of Ser. No. 650,660, Sep. 14, 1984, Pat. No. 4,947,230.

[51] Int. Cl.$^5$ .................................. H01L 21/44
[52] U.S. Cl. ................................ 437/175; 437/31; 437/51; 437/55; 437/917; 148/DIG. 11; 148/DIG. 87
[58] Field of Search .............. 437/31, 32, 55, 917, 437/175; 357/92, 15, 46; 148/DIG. 87, DIG. 85, 54

[56] References Cited

U.S. PATENT DOCUMENTS

| | | | |
|---|---|---|---|
| 3,904,450 | 9/1975 | Evans et al. | 437/917 |
| 3,909,700 | 9/1975 | Ferro | 357/15 |
| 3,922,565 | 11/1975 | Berger et al. | 148/DIG. 87 |
| 3,961,351 | 6/1976 | Blatt | 148/DIG. 87 |
| 3,962,717 | 6/1976 | O'Brien | 148/DIG. 87 |
| 4,071,774 | 1/1978 | Tokumaru et al. | 357/92 |
| 4,075,039 | 2/1978 | Sloan, Jr. | 357/46 |
| 4,076,556 | 2/1978 | Agraz-Guerena et al. | 437/55 |
| 4,087,900 | 5/1978 | Xiannoulos | 437/55 |
| 4,190,466 | 2/1980 | Bhtattacharyya | 437/33 |
| 4,260,906 | 4/1981 | Tokumaru et al. | 357/92 |
| 4,567,644 | 2/1986 | Allison | 437/31 |
| 4,669,180 | 6/1987 | Thomas et al. | 437/178 |
| 4,947,230 | 8/1990 | Kapoor | 357/92 |

Primary Examiner—Brian E. Hearn
Assistant Examiner—Michael Trinh
Attorney, Agent, or Firm—Burns, Doane, Swecker & Mathis

[57] ABSTRACT

A base-coupled logic gate is characterized by input Schottky diodes that are directly formed on the base region of the switching transistor for the gate. A logic of this type provides flexible circuit arrangements and savings in required area, while achieving very high speeds. As a result of the savings in area, the buried layer capacitance of the gate is also reduced, which facilitates the high-speed operation of the circuit.

9 Claims, 2 Drawing Sheets

METHOD OF FABRICATING A BASE-COUPLED TRANSISTOR LOGIC

This application is a divisional of application Ser. No. 06/650,660, filed Sep. 14, 1984, U.S. Pat. No. 4,947,230.

BACKGROUND OF THE INVENTION

The present invention is directed to bipolar transistor logic gates, and more particularly to gates of this type that combine high speed operation with high packing density.

Logic gates that are constructed utilizing Schottky transistor logic (STL) are noted for their high switching speeds, and find utility in a number of applications because of this characteristic. Basically, an STL gate comprises a Schottky transistor, i.e., a bipolar transistor with a Schottky diode clamp between its base and collector. The cathodes of a plurality of Schottky diodes are each connected to the collector of the Schottky transistor, and their anodes comprise the output terminals for the gate. In operation, the clamp between the base and collector of the Schottky transistor prevents this transistor from going into saturation. Consequently, the transistor is quick to respond to changes in the voltage levels at its base. Further information regarding the features and operating characteristics of an STL gate can be found in the article "STL Technology" by Ben J. Sloan, *IEDM Technical Digest* 1979, pp. 324-327.

While STL gates are desirable from the standpoint of their high switching speed, one drawback that has heretofore been associated with them is the comparatively large area that is required for each gate, resulting in a low packing density on a chip. More particularly, in a conventional STL gate, each of the output Schottky diodes is formed on a separate island on the chip, which increases the area of the buried layer for the chip and adds to the isolation area on the chip. The higher the fan-out for each gate, the greater the number of islands that must be provided per gate. For example, a conventional STL gate having a fan-out of four requires five islands, one for each of the four Schottky diodes and one for the transistor collector. The need to provide each of these separate areas on the chip limits the packing density that can be obtained.

BRIEF STATEMENT OF THE INVENTION

It is an object of the present invention to provide a novel transistor logic that retains the high speed switching capabilities of Schottky transistor logic but that requires considerably less area on a chip.

It is a further object of the present invention to provide a novel transistor logic that can be used with both STL and integrated-injection logic (I²L) configurations.

It is a further object of the present invention to provide a novel transistor logic that is capable of providing a multiple-input/multiple-output logic gate utilizing I²L logic.

In accordance with the present invention, the foregoing objects, and their attendant advantages, are achieved with a base-coupled logic in which input Schottky diodes are directly formed on the base region of the switching transistor for a gate. A logic of this type provides flexible circuit arrangements and savings in required area, while achieving very high speeds. As a result of the savings in area, the buried layer capacitance of the gate is also reduced, which facilitates the high-speed operation of the circuit.

Further features of the invention are described hereinafter with reference to preferred embodiments of the invention illustrated in the accompanying drawings.

DESCRIPTION OF THE ILLUSTRATED EMBODIMENTS

Figure 1:
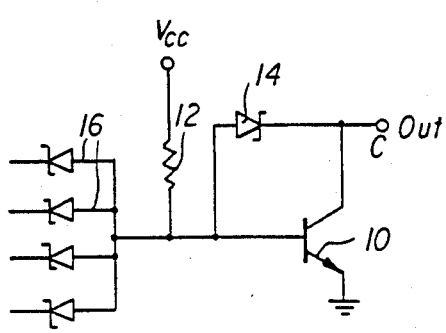
FIG. 1 is a schematic circuit diagram of a basecoupled transistor logic gate embodying the present invention.

Referring to FIG. 1, a base-coupled logic gate comprises a bipolar transistor 10 whose collector forms the output terminal of the gate and whose emitter is grounded. A current source $V_{CC}$ is connected to the base of the transistor 10 by means of a resistor 12, and a Schottky diode 14 is connected between the base and collector of the transistor to clamp the base current. The input terminals of the gate are formed by Schottky diodes 16 each having their anode connected to the base of the transistor 10. The cathodes of the diodes represent the input terminals of the gate.

The gate represented in FIG. 1 is a wired NAND gate. In operation, when the input signal at each of the four input terminals is at a high voltage level, the Schottky diodes 16 are reverse biased and the current from the source $V_{CC}$ is applied to the base of the transistor. This causes the transistor to conduct, resulting in a low voltage output signal, e.g. 0.1 volt, at the output terminal of the gate.

When the signal at any one or more of the input Schottky diodes goes low, a current sink is formed and the current from the source $V_{CC}$ is diverted away from the base of the transistor 10. Consequently, the transistor turns off to present a high level output signal.

Figure 2:
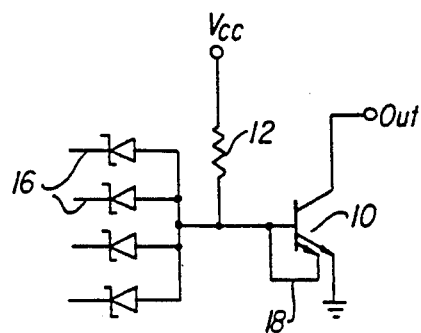
FIG. 2 is a schematic circuit diagram of an alternate embodiment of a logic gate that employs the principles of the present invention.

A variation of this logic gate is illustrated in FIG. 2. In this embodiment, there is no Schottky diode 14 that forms a clamp between the base and collector of the transistor. Rather, the transistor is provided with a second emitter 18, which is tied back to the base of the transistor. This emitter feedback operates in a fashion analogous to the clamp, to limit the base voltage of the transistor and thereby prevent it from going into deep saturation.

In accordance with the present invention, considerable savings in the required area for each gate is achieved by forming the input Schottky diodes directly on the base region for the switching transistor 10 of the gate. More particularly, using presently available technology, the Schottky diodes 16 are formed by depositing a Schottky-type metal, or more preferably a rare earth silicide, directly onto the p-type material that comprises the base of the transistor, to form the Schottky barrier. The majority carries in a diode of this type comprise the holes which are emitted by the p-type base material and move to the metal or silicide coating when the base material is more positively biased than the coating.

Figure 3A:
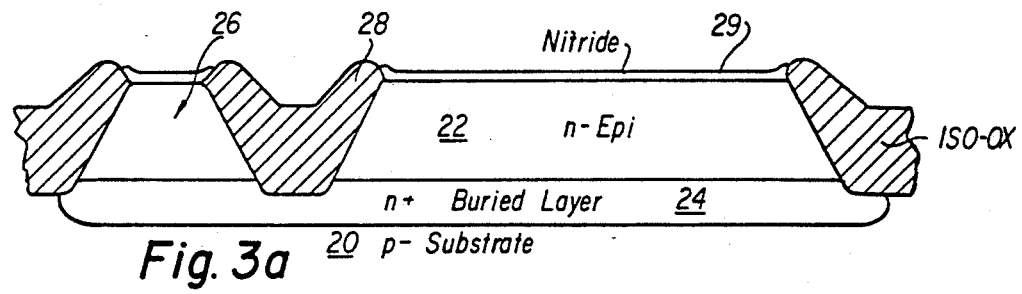
FIGS. 3a-3d are cross-sectional views of a monolithic circuit during various steps in the fabrication of a logic gate embodying the present invention.
Figure 3B:
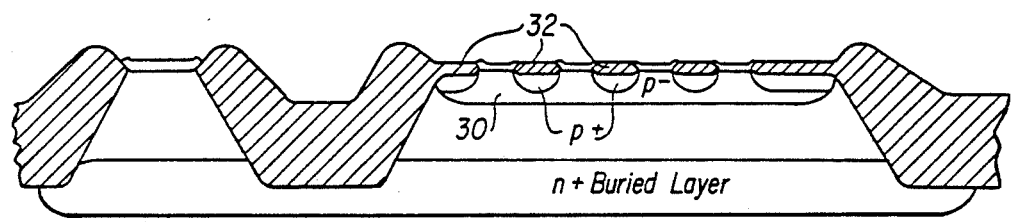
Figure 3C:
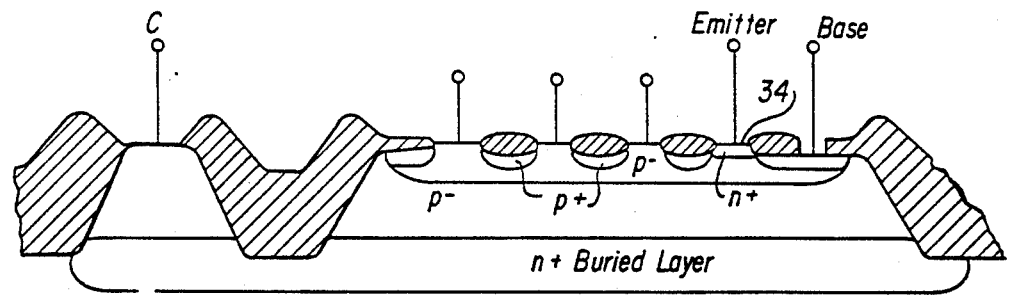

Various steps in the fabrication of a logic gate in accordance with the principles of the present invention are depicted in the cross-sectional illustrations of FIGS. 3a–3c. Using known techniques, a semiconductor wafer is processed in a conventional manner to produce the structure illustrated in FIG. 3a. This structure comprises a p-type substrate 20 having an n-type epitaxial layer 22 grown thereon. An $n^{30}$ buried layer 24 is sandwiched between the substrate and the epitaxial layer. A collector region 26 is isolated in the n-type epitaxial layer by means of an oxide layer 28. For example, a technique such as trench isolation can be used to form the collector region and thereby reduce the buried layer capacitance of the device. A nitride layer 29 is deposited over the exposed portion of the epitaxial layer for subsequent control purposes.

Referring to FIG. 3b, the epitaxial layer is lightly doped with boron, or a similar such dopant having p-type conductivity, to form the intrinsic base region 30 of the transistor. By "lightly doped" is meant that the concentration of acceptor atoms in the base region is in the order of magnitude of $10^{15}$–$10^{17}$ atoms cm$^{-3}$, and preferably about $10^{16}$ atoms cm$^{-3}$, as opposed to the usual concentration of $10^{19}$–$10^{20}$ atoms cm$^{-3}$ for normal or heavily doped materials. After the light doping, a mask is used to etch the nitride control layer from the base island except in the areas where the active devices, i.e., the Schottky diodes and the emitter, are to be formed. A layer of oxide 32 is grown over the regions of the epitaxial layer that are not covered by the nitride.

Referring now to FIG. 3c, boron is optionally implanted through the oxide while the active device regions are covered to reduce the series resistance base region. Of course, the resistance can be reduced through other techniques, e.g., appropriate circuit design, to forego with the need for the second implantation of the acceptor material. If this implantation is carried out, it is preferably done using a critical mask, i.e., one having an alignment tolerance of about 0.5 micron. Following this implantation, one of the nitride sections is removed, for example by etching, and arsenic, or other suitable n-type dopant, is implanted in this area to form the emitter region 34. The emitter implant is annealed and the remaining nitride on the wafer is removed. A silicide is deposited in those areas from which the nitride has been removed, to form the Schottky barriers for the input diodes 16. Preferably, a rare-earth silicide is used to form the Schottky barrier on the p-type material, as disclosed in the article "The Schottky-Barrier Height of the Contacts Between Some Rare-Earth Metals (and Silicides) and p-type Silicon" by H. Norde et al, Appl. Phys. Lett. 38(11), June 1, 1981, pp. 865–867. A hole is made in the oxide layer 32 and a base contact is deposited thereon, to enable the current source $V_{CC}$ to be connected to the transistor. In addition, the collector contact is deposited on the collector isolation region 26. FIG. 3c illustrates the cross-section of the completed base-coupled logic gate.

Figure 3D:
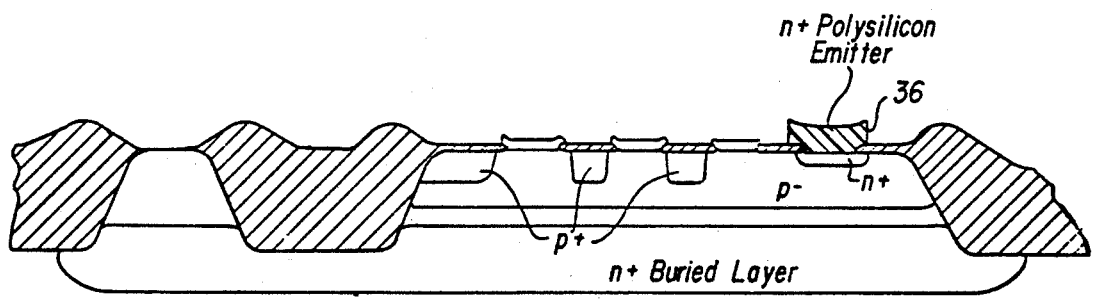

As an alternative to the implantation of arsenic, the emitter of the bipolar transistor can be formed by diffusing arsenic or any other n-type dopant from a layer of polysilicon which has previously been doped with the dopant. After the growth of oxide in regions isolated by the layer of nitride on the epitaxial layer, as shown in FIG. 3b, and removal of the nitride layer from above the emitter, a layer 36 of polysilicon, around 0.2 to 0.5 microns thick, is deposited over the whole wafer. Next, it is implanted with arsenic or any other n-type dopant to a dose of approximately $1 \times 10^{15}$ to $1 \times 10^{16}$ atoms cm$^{-2}$. The polysilicon is etched, using photoresist as a mask, from all the areas except above the emitter. A thin oxide is grown on the polysilicon emitter next, and the emitter is formed by diffusion of the n-type impurity from the polysilicon bar. The resulting structure is shown in FIG. 3d. The remaining process steps follow the description stated previously with respect to FIG. 3c.

From the foregoing, it can be seen that all of the Schottky diodes are formed on the base island for the transistor, which provides a tremendous savings in area over prior techniques and thus leads to higher packing densities. It is estimated that packing density can be increased by up to 100% with this technique. Furthermore, this logic reduces the buried layer capacitance of the gate, thus contributing to its high speed operation.

Figure 4:
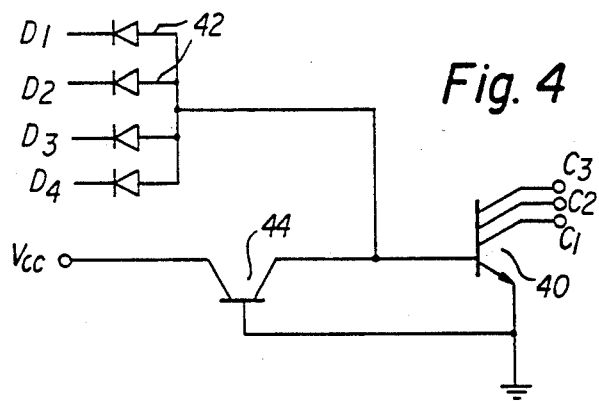
FIG. 4 is a schematic circuit diagram of an integrated injection logic (I²L) gate which employs the present invention.

This technique is not limited to gates which employ Schottky transistors. More particularly, it is applicable to transistors that act in an upward mode, such as an I$^2$L transistor. The schematic circuit diagram for such a gate is illustrated in FIG. 4. Like the STL gate, the I$^2$L gate includes a switching transistor 40 whose emitter is grounded and whose collector forms the output terminal of the gate. In this case, however, the transistor has multiple collectors, each of which comprises an output terminal. The input signals to the gate are fed to the transistor through Schottky diodes 42. The current for driving the switching transistor 40 is supplied to the base of the transistor through an injection transistor 44. Whereas the switching transistor 40 is an NPN type transistor, the injection transistor 44 is of a complementary type, i.e., PNP. Its collector is connected to the base of the switching transistor 40 and its base is tied to the emitter of the switching transistor 40, i.e., it is grounded. The emitter of the injection transistor 44 is connected to the current source $V_{CC}$.

Figure 5:
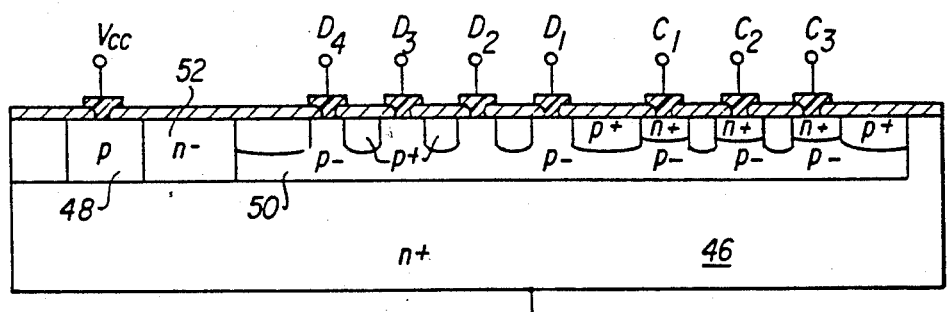
FIG. 5 is a cross-sectional view of a monolithic I²L gate constructed in accordance with the present invention.

An implementation of the principles of the present invention in an I$^2$L gate is illustrated in a cross-sectional form in FIG. 5. As is conventional, the emitter of the switching transistor 40 and the base of the injection transistor 44 are embodied in an n+ type substrate 46 that is held at a ground or negative potential. P-type diffusions 48 and 50 in an n-type epitaxial layer 52 grown on the substrate respectively form the injector (emitter of the injection transistor) and the base of the switching transistor. Diffusions of n+ type material in the base region form the collectors of the switching transistor (output terminals of the gate).

As in the previously described embodiment, the input terminals for the gate are comprised of Schottky diodes that are formed directly on the base region, rather than being isolated therefrom on separate islands. This formation of the input terminals on the p-type base region allows them to be isolated and results in a true multiple-input/multiple-output gate.

Basically, this gate can be fabricating using conventional I$^3$L (isolated integrated injection logic) processes. However, in accordance with the present invention, the surface dopant concentration in the base region is lower than is conventional, so that the Schottky diodes can be reliably formed therein.

From the foregoing, it will be appreciated that the present invention provides an integrated logic gate configuration that does not require a compromise between the highly desirable objectives of high switching speed and high packing density. Rather, it enables both to be achieved in a single gate. Furthermore, with respect to integrated injection logic, it provides a more versatile gate having both multiple inputs and multiple outputs.

It will be appreciated by those of ordinary skill in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A method for fabricating a monolithic transistor logic circuit, comprising the steps of:
    forming two isolated islands of a semiconductor material of one conductivity type on a substrate;
    depositing a control layer on at least one of said islands;
    lightly doping said at least one island with an impurity of a conductivity type opposite to said one type;
    removing the control layer form said at least one island except in the areas where active devices are to be formed;
    growing a layer of oxide in those regions from which the control layer was removed;
    removing the control layer from one of said areas and doping said area with an impurity of said one conductivity type to form an emitter;
    removing the remaining control layer on said islands; and
    forming Schottky diodes on said areas of said one island other than said emitter to provide the input terminals for said logic circuit.

2. The method of claim 1 wherein said one conductivity type is n-type and said opposite conductivity type is p-type.

3. The method of claim 1 wherein said step of lightly doping comprises the process of implanting said impurity to a concentration of the order of magnitude of $10^{15}-10^{17}$ atoms $cm^{-3}$ in the semiconductor material.

4. The method of claim 1 further comprising the step of implanting an impurity of said opposite conductivity type through the layer of oxide, to reduce the series resistance of said one island.

5. The method of claim 1 wherein said emitter is formed by implanting the impurity in said one area.

6. The method of claim 1 wherein said emitter is formed by depositing a layer of polysilicon over said one area, doping said polysilicon with the impurity, and diffusing the impurity from the polysilicon into said one area.

7. The method of claim 9 wherein said control layer is a layer of nitride.

8. A method of fabricating a base-coupled logic gate, comprising the steps of:
    growing a n-type epitaxial layer on a semiconductor substrate;
    forming a p-type base region in said epitaxial layer;
    providing a n-type collector region in said base region in an upward mode configuration to form an output terminal of the gate;
    depositing one of a metal or a silicide on said base region to form multiple Schottky diodes which comprise multiple input terminals for the gate;
    providing isolation regions in said p-type base region between said multiple Schottky diodes; and
    forming an emitter region in said epitaxial layer that is isolated from said base region by a portion of said epitaxial layer.

9. The method of claim 8 wherein multiple collector regions are formed on said base region to provide multiple output terminals.

* * * * *